United States Patent
Ju et al.

(10) Patent No.: US 10,468,839 B2
(45) Date of Patent: Nov. 5, 2019

(54) ASSEMBLY HAVING THERMAL CONDUCTION MEMBERS

(71) Applicant: LOTES CO., LTD, Keelung (TW)

(72) Inventors: Ted Ju, Keelung (TW); Chin Chi Lin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/019,850

(22) Filed: Jun. 27, 2018

(65) Prior Publication Data

US 2019/0006802 A1 Jan. 3, 2019

(30) Foreign Application Priority Data

Jun. 29, 2017 (CN) .................... 2017 2 0770569 U
Jun. 29, 2017 (CN) .................... 2017 2 0770570 U

(51) Int. Cl.
*H01R 24/78* (2011.01)
*H01R 43/02* (2006.01)
(Continued)

(52) U.S. Cl.
CPC ........... *H01R 24/78* (2013.01); *H01R 13/516* (2013.01); *H01R 13/6658* (2013.01);
(Continued)

(58) Field of Classification Search
CPC ...... H01R 24/78; H01R 13/46; H01R 13/516; H01R 13/6658; H01R 43/0256;
(Continued)

(56) References Cited

U.S. PATENT DOCUMENTS 6,287,146 B1* 9/2001 Avery ................ H01R 12/7029
439/607.4
7,198,412 B2* 4/2007 Hamasaki ............ G02B 6/4249
385/14
(Continued)

FOREIGN PATENT DOCUMENTS

| CN | 105610015 A | 5/2016 |
|----|-------------|--------|
| CN | 106058557 A | 10/2016 |
| CN | 206100746 U | 4/2017 |

*Primary Examiner* — Travis S Chambers
(74) *Attorney, Agent, or Firm* — Locke Lord LLP; Tim TingKang Xia, Esq.

(57) ABSTRACT

An assembly includes: a socket connector, having an insulating seat, multiple mating terminals and a metal shell provided outside the insulating seat; at least one first thermal conduction member located outside the metal shell; and a plug connector, including: a circuit board; at least one chip provided on the circuit board; a mating joint electrically connected to one end of the circuit board and having an insulating body, multiple conductive terminals, and a shielding shell provided outside the insulating body; and at least one second thermal conduction member having a conducting portion thermally conductive with the chip and a protruding portion located outside the shielding shell. When the mating joint is mated with the socket connector, the mating terminals are in contact with the conductive terminals to form an electrical connection, and the protruding portion is in contact with the first thermal conduction member to perform thermal conduction.

20 Claims, 13 Drawing Sheets

(51) Int. Cl.
  *H01R 13/66* (2006.01)
  *H05K 7/20* (2006.01)
  *H01R 13/516* (2006.01)

(52) U.S. Cl.
  CPC ....... *H01R 43/0256* (2013.01); *H05K 7/2039* (2013.01); *H05K 7/20154* (2013.01); *H05K 7/20918* (2013.01)

(58) Field of Classification Search
  CPC ........ H01R 24/60; G06F 1/20; H05K 7/2039; H05K 7/20154; H05K 7/20918; H05K 1/0201; H05K 7/20; H05K 1/0203
  USPC .................................. 439/527, 196, 485–487
  See application file for complete search history.

(56) References Cited

U.S. PATENT DOCUMENTS

| | | | |
|---|---|---|---|
| 7,286,346 B2 * | 10/2007 | Chiba ................... | G06F 1/1632 165/104.33 |
| 10,381,771 B2 * | 8/2019 | Ju ......................... | H01R 13/506 |
| 2015/0295356 A1 * | 10/2015 | Tziviskos .............. | H01R 24/64 439/248 |

* cited by examiner

ASSEMBLY HAVING THERMAL CONDUCTION MEMBERS

CROSS-REFERENCE TO RELATED PATENT APPLICATION

This non-provisional application claims priority to and the benefit of, pursuant to 35 U.S.C. § 119(a), patent application Serial Nos. CN201720770570.8 and CN201720770569.5, both filed in China on Jun. 29, 2017. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an assembly, and more particularly to an assembly having thermal conduction members.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A commonly used plug connector in the industry includes a circuit board, a mating joint electrically connected to one end of the circuit board, a cable electrically connected to the other end of the circuit board, and a metal shell covering a rear end of the mating joint and outside of the circuit board. Currently, due to the increasingly powerful functions of electronic devices, the signal transmission requirements on plug connectors are also increasing. In order to enable the plug connector to have greater data transmission bandwidth and the ability to transmit uncompressed audio signals and high resolution video signals, a chip is generally installed on the circuit board to enhance the decoding capability of the plug connector. However, it is well-known that, as the chip speed becomes faster and the required power is also increased, the chip will generate a lot of heat during operation. If the heat is not dissipated in time, the chip will become too hot and fail, and the plug connector will be damaged, resulting in failure of the entire electronic device.

In order to solve this problem, the metal shell is provided with an abutting portion, which elastically abuts the chip, such that the heat generated by the chip is transferred to the metal shell, and then heat exchange is performed with the outside air through the metal shell to achieve the purpose of heat dissipation. However, due to the low thermal conductivity of the metal shell, the heat transfer rate is slow, such that the heat generated by the chip cannot be quickly dissipated, resulting in poor heat dissipation effect, and affecting the reliability of the signal transmission of the plug connector.

Therefore, a heretofore unaddressed need to design a new assembly having thermal conduction members exists in the art to address the aforementioned deficiencies and inadequacies.

SUMMARY

The invention is directed to an assembly having thermal conduction members, which can quickly dissipate heat generated by the chip inside the plug connector.

To achieve the foregoing objective, the present invention adopts the following technical solutions:

An assembly includes: a socket connector, having an insulating seat, a plurality of mating terminals provided on the insulating seat, and a metal shell provided outside the insulating seat; at least one first thermal conduction member, located outside the metal shell; and a plug connector, including: a circuit board; at least one chip, provided on the circuit board; a mating joint, electrically connected to one end of the circuit board, wherein the mating joint has an insulating body, a plurality of conductive terminals provided on the insulating body, and a shielding shell provided outside the insulating body; and at least one second thermal conduction member, having at least one conducting portion and at least one protruding portion, wherein the conducting portion is thermally conductive with the chip, the protruding portion is located outside the shielding shell. When the mating joint is mated with the socket connector, the mating terminals are in contact with the conductive terminals to form an electrical connection, and the protruding portion is in contact with the first thermal conduction member to perform thermal conduction.

In certain embodiments, at least one of the first thermal conduction member and the second thermal conduction member is a thermal transistor or a capillary.

In certain embodiments, the assembly further includes a fixed seat, wherein the socket connector and the first thermal conduction member are respectively provided on the fixed seat.

In certain embodiments, the assembly further includes a casing and a heat dissipating device provided in the casing, wherein the casing has an opening communicating with an outside, the socket connector and the first thermal conduction member are respectively exposed to the opening, and the heat dissipating device is configured to perform heat dissipation on the first thermal conduction member.

In certain embodiments, the assembly further includes a heat dissipating device, wherein the first thermal conduction member is connected with the heat dissipating device.

In certain embodiments, the first thermal conduction member has an accommodating slot configured for insertion of the protruding portion.

In certain embodiments, the plug connector further comprises an insulating shell provided on a rear end of the shielding shell, wherein the conducting portion is accommodated in the insulating shell, the insulating shell has a front end surface, and the shielding shell and the protruding portion respectively protrude forward from the front end surface.

In certain embodiments, a length of the protruding portion protruding forward relative to the front end surface is greater than a length of the mating joint protruding forward relative to the front end surface.

In certain embodiments, the insulating shell is injection-molded to the rear end of the shielding shell, and the second thermal conduction member is insert-molded in the insulating shell.

In certain embodiments, the plug connector further comprises a shielding cover provided on a rear end of the mating joint, the circuit board is accommodated in the shielding cover, and the conducting portion penetrates through the shielding cover to be in contact with the chip.

In certain embodiments, the conducting portion is in contact with at least one of the shielding cover and the shielding shell.

In certain embodiments, the plug connector further comprises a shielding cover provided at a rear end of the mating joint, wherein the circuit board is accommodated in the shielding cover, the shielding cover has at least one abutting portion in contact with the chip, and the conducting portion is in contact with the shielding cover.

In certain embodiments, the first thermal conduction member is a casing made of a metal material, one side of the casing is provided with an opening, and the socket connector is exposed to the opening and mated with the plug connector.

In certain embodiments, a main board and a heat dissipating device are provided in the casing, the socket connector is mounted on the main board, and when the mating joint is mated with the socket connector, the protruding portion at least partially protrudes into the casing, and the heat dissipating device accelerates air flow around the protruding portion to perform heat dissipation on the second thermal conduction member.

In certain embodiments, the casing is provided with an insertion hole on at least one side of the opening for the protruding portion to pass therethrough, and the insertion hole is isolated from the opening.

In certain embodiments, the heat dissipating device has an air outlet, the air outlet and one of the at least one protruding portion are located on a same side of the socket connector as one of the protruding portion, and the air outlet is provided to be away from the socket connector relative to the one of the at least one protruding portion.

In certain embodiments, a front end of the insulating body has a mating slot, each of the conductive terminals has a contact portion protruding into the mating slot, the contact portions of the conductive terminals are provided in two rows on an upper side and a lower side of the mating slot, two second thermal conduction members are provided at a left side and a right side of the mating joint, the two protruding portions of the two second thermal conduction members are symmetrical about a center of the mating slot at 180 degrees, and the plug connector is mated with the socket connector forwardly or reversely.

Compared with the related art, the plug connector according to certain embodiments of the present invention is provided with the second thermal conduction member which is thermally conductive with the chip therein, and the first thermal conduction member is provided outside the metal shell of the socket connector. When the plug connector as a whole moves toward the socket connector and is mated with the socket connector, the protruding portion of the second thermal conduction member is in contact with the first thermal conduction member to perform thermal conduction, such that the heat generated by the chip can be transferred to the first thermal conduction member through the second thermal conduction member, thereby quickly dissipating the heat generated by the chip.

To achieve the foregoing objective, the present invention also adopts the following technical solutions:

A plug connector includes: a circuit board; at least one chip, provided on the circuit board; a mating joint, electrically connected to one end of the circuit board, wherein the mating joint has an insulating body, a plurality of conductive terminals provided on the insulating body, and a shielding shell provided outside the insulating body, the insulating body has a mating slot, each of the conductive terminals has a contact portion protruding into the mating slot, and the contact portions of the conductive terminals are provided in two rows on two opposite sides of the mating slot; and at least one thermal conduction member, having at least one conducting portion and at least one protruding portion, wherein the conducting portion is thermally conductive with the chip, and the protruding portion is located outside the shielding shell.

In certain embodiments, a thermal conductivity of the thermal conduction member is higher than a thermal conductivity of the shielding shell.

In certain embodiments, the two rows of the contact portions are symmetrical about a center of the mating slot at 180 degrees, two thermal conduction members are provided at a left side and a right side of the mating joint, and the two protruding portions of the two thermal conduction members are symmetrical about the center of the mating slot at 180 degrees.

Compared with the related art, the plug connector according to certain embodiments of the present invention is provided with the thermal conduction member which is thermally conductive with the chip therein. The heat generated by the chip can be transferred to the thermal conduction member, thereby quickly dissipating the heat generated by the chip.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
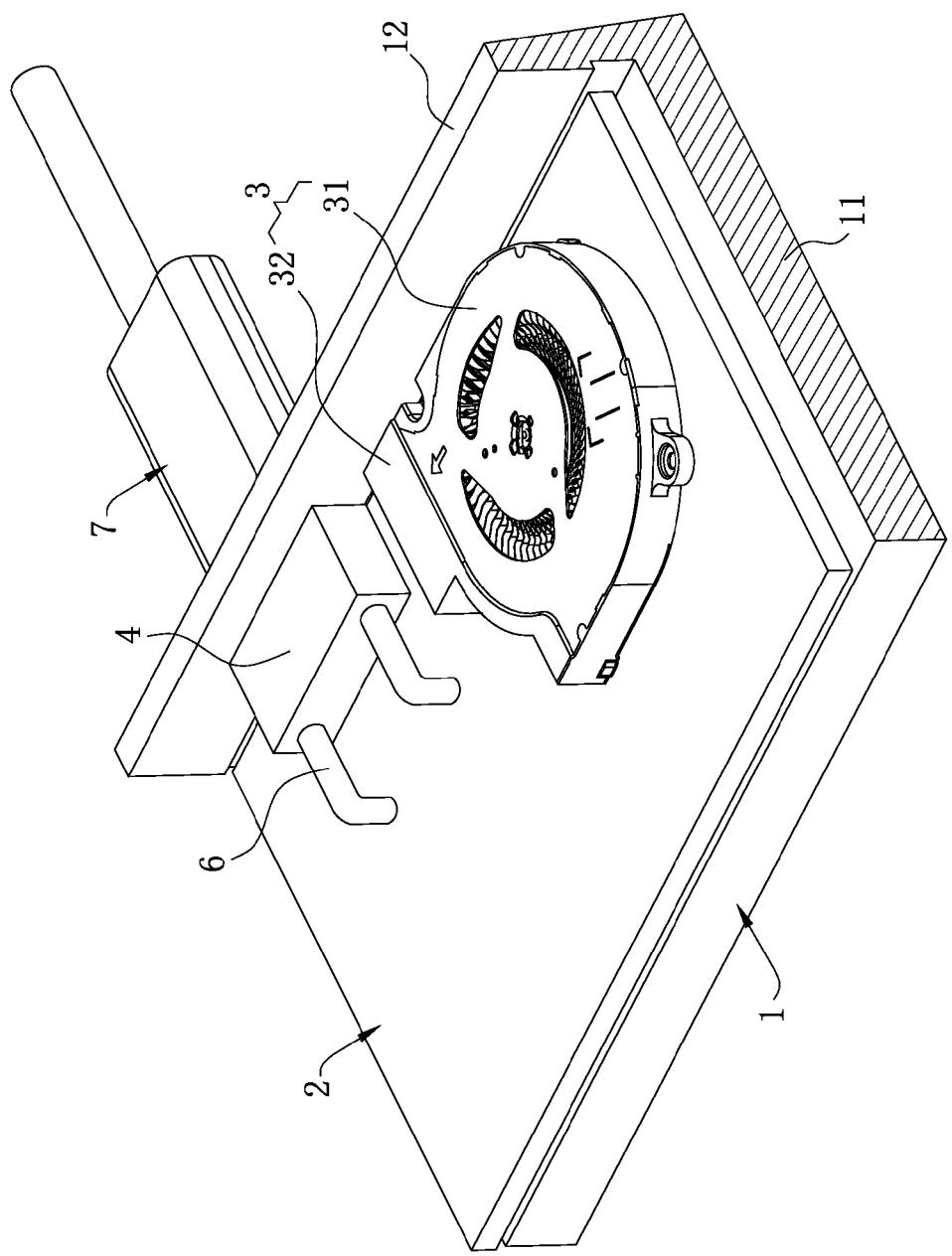
FIG. 1 is a perspective view of an assembly having thermal conduction members according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-13. In accordance with the purposes of this invention, as embodied and broadly described herein, this invention, in one aspect, relates to an assembly having thermal conduction members.

Referring to FIG. 1 to FIG. 6, an assembly having thermal conduction members according to a first embodiment of the present invention is provided. The assembly includes a casing 1, a main board 2 and a heat dissipating device 3 provided in the casing 1, a fixed seat 4 provided on the main board 2, a socket connector 5 electrically connected to the main board 2, two first thermal conduction members 6 fixedly provided on the fixed seat 4, and a plug connector 7 mated with the socket connector 5. The plug connector 7 and the socket connector 5 can implement forward or reverse insertion in a front-rear direction, and the two first thermal conduction members 6 are located on the left and right sides of the socket connector 5. In this embodiment, the casing 1 and the first thermal conduction members 6 are different and separate components. The casing 1 may be a shell of a portable computer or a shell of a desktop computer mainframe box. Of course, the casing 1 may also be a shell of other types of electronic devices or the like.

Figure 3:
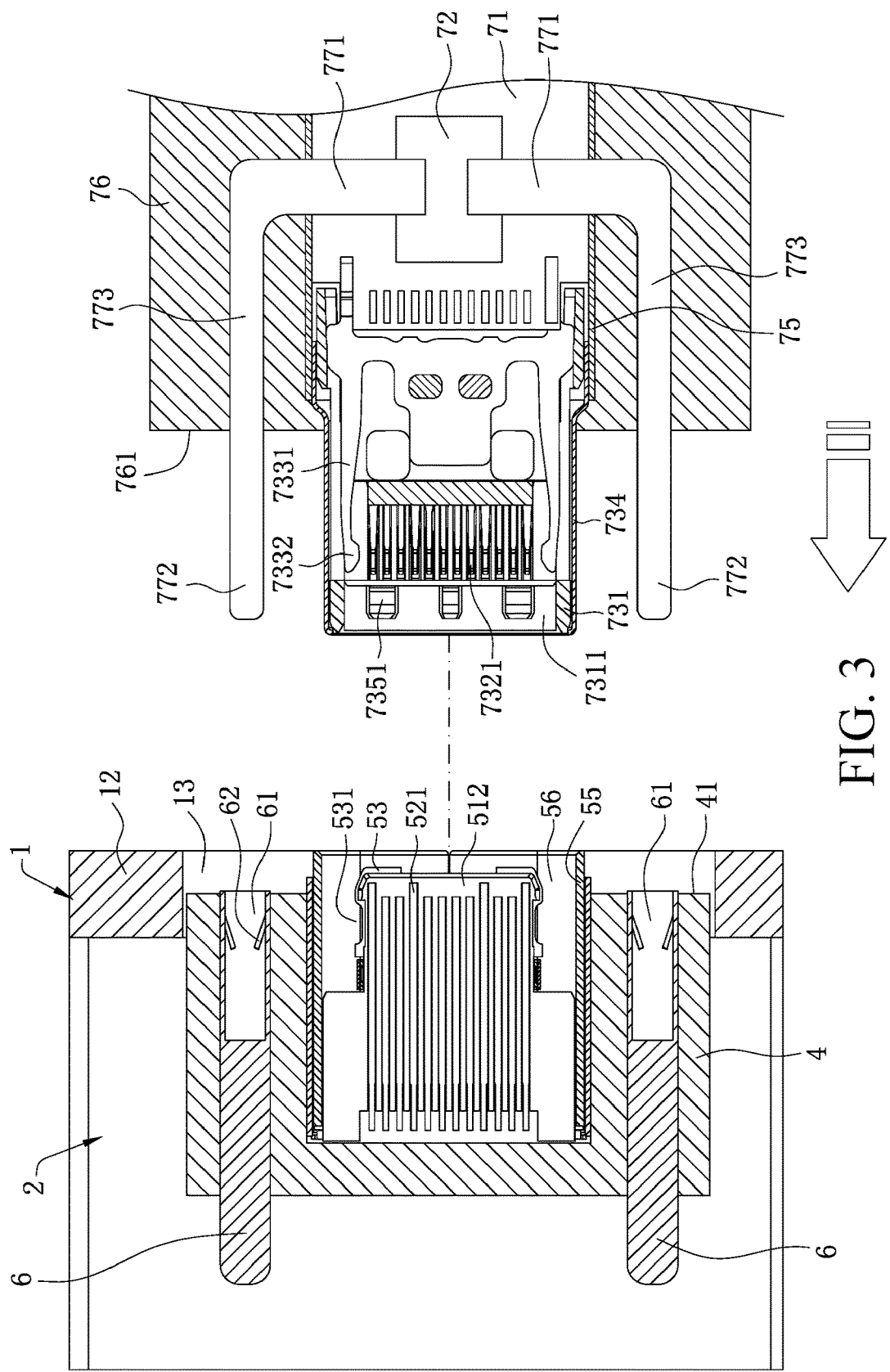
FIG. 3 is a local sectional schematic view of FIG. 1 before the plug connector is inserted into the socket connector.

Referring to FIG. 1 and FIG. 3, the casing 1 may be made of a plastic material or metal material. In this embodiment, the casing 1 is made of a plastic material. The casing 1 has a bottom wall 11 and multiple side walls 12 extending upward from the bottom wall 11. The main board 2 is mounted on the bottom wall 11, and one of the side walls 12 is provided with an opening 13 communicating with outside.

Figure 2:
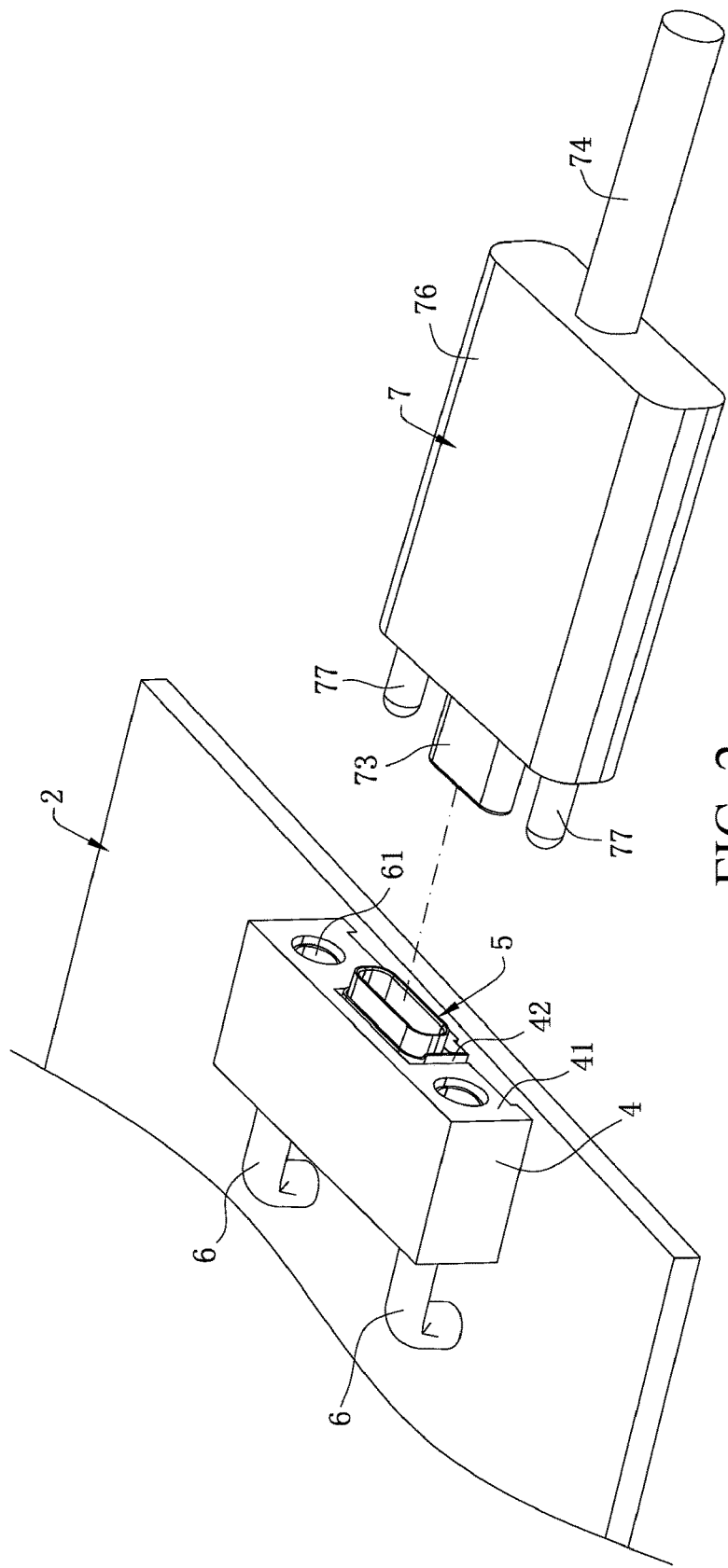
FIG. 2 is a local perspective view of FIG. 1 before the plug connector is inserted into the socket connector.

Referring to FIG. 1 and FIG. 2, in this embodiment, the heat dissipating device 3 is mounted on the main board 2. The heat dissipating device 3 is a fan, and the heat dissipating device 3 is provided adjacent to the socket connector 5 and the first thermal conduction members 6. The heat dissipating device 3 has a fan body 31 and an air outlet 32 connected to the fan body 31, and the air outlet 32 directly faces the socket connector 5 and the first thermal conduction members 6. In other embodiments, the heat dissipating device 3 may also be mounted on another component or device in the casing 1, or the heat dissipating device 3 may also be mounted on the casing 1.

Referring to FIG. 1 to FIG. 3, the fixed seat 4 is substantially a rectangular body. The fixed seat 4 has a mating surface 41, and the mating surface 41 is exposed to the opening 13. One surface of the fixed seat 4 opposite to the mating surface 41 is accommodated in the casing 1. The bottom surface of the fixed seat 4 is upward concavely provided with an accommodating space 42. The accommodating space 42 runs through the mating surface 41 in the front-rear direction. The socket connector 5 is accommodated in the accommodating space 42, and the socket connector 5 partially protrudes out of the mating surface 41. One end of each of the first thermal conduction members 6 is exposed to the mating surface 41. Thus, both the socket connector 5 and the first thermal conduction members 6 are exposed to the same opening 13.

Figure 4:
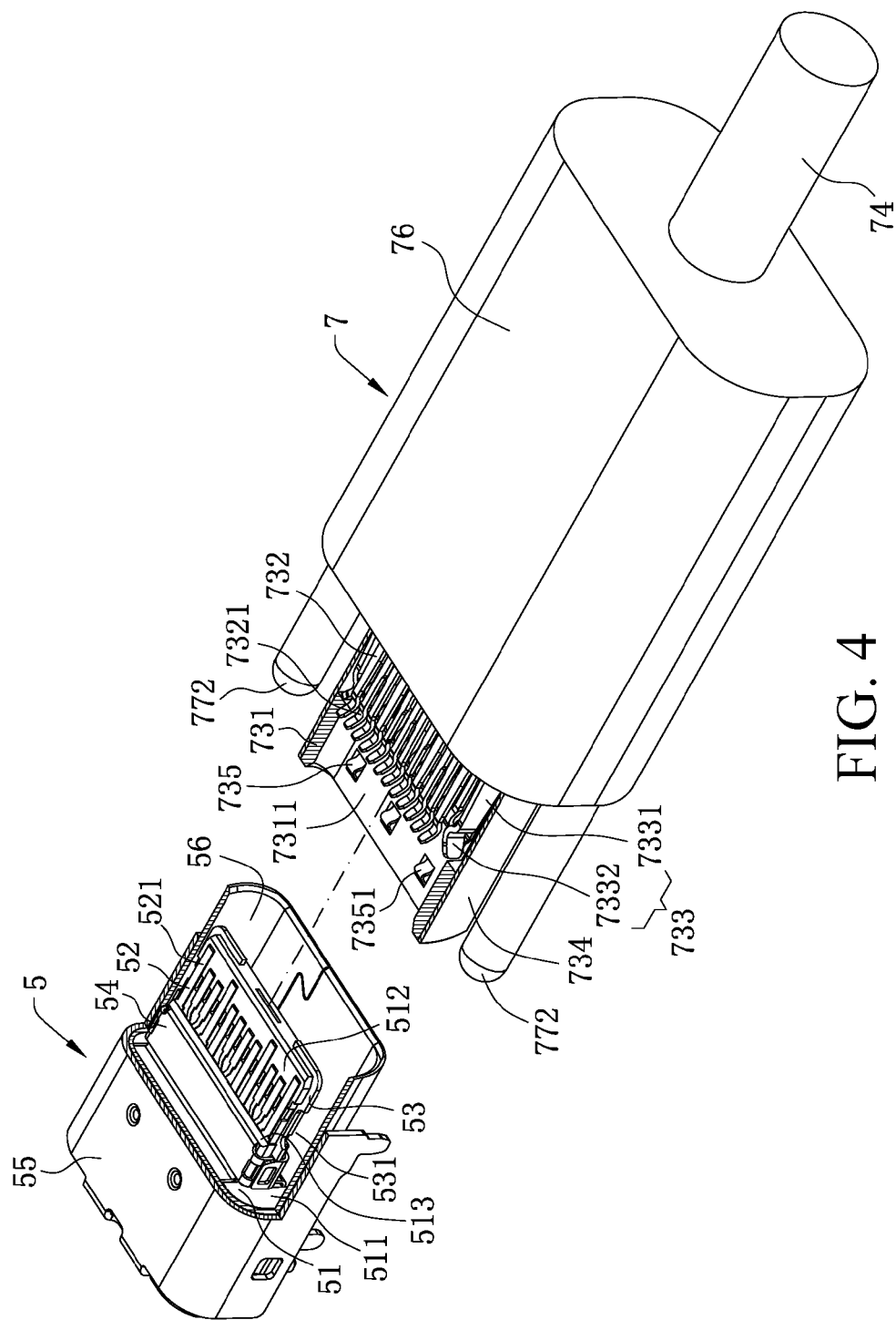
FIG. 4 is a local sectional perspective view of FIG. 2 before the plug connector is mated with the socket connector.

Referring to FIG. 3 and FIG. 4, the socket connector 5 includes an insulating seat 51, multiple mating terminals 52, a middle shielding plate 53, two grounding members 54 and a metal shell 55. The insulating seat 51 has a base 511, a tongue 512 located on one end of the base 511 and a step portion 513 provided between the base 511 and the tongue 512. The base 511, the step portion 513 and the tongue 512 are sequentially provided in the front-rear direction. The two grounding members 54 are provided on the opposite upper and lower surfaces of the step portion 513, and the two grounding members 54 are buckled with each other on the left and right sides of the step portion 513. The grounding members 54 are in contact with the metal shell 55. The mating terminals 52 are provided in upper and lower rows on the insulating seat 51, and each of the mating terminals 52 has a first contact portion 521. The first contact portions 521 of the mating terminals 52 are exposed to the opposite upper and lower surfaces of the tongue 512, and the mating terminals 52 in each row satisfy USB Type-C terminal arrangement. The mating terminals 52 in each row include, sequentially from left to right, a grounding terminal, a pair of differential signal terminals (high-speed terminals) for transmitting USB 3.0 signals, a power terminal, a reserved terminal, a pair of USB 2.0 terminals, a reserved terminal, a power terminal, a pair of differential signal terminals (high-speed terminals) for transmitting USB 3.0 signals and a grounding terminal. The middle shielding plate 53 is provided on the insulating seat 51 and located between the two rows of the mating terminals 52. The left and right sides of the middle shielding plate 53 correspondingly protrude out of the left and right sides of the tongue 512. The middle shielding plate 53 is further provided with two buckling notches 531, and each of the two buckling notches 531 is exposed to each of the left and right sides of the tongue 512. The metal shell 55 is sleeved over the insulating seat 51, and the metal shell 55 forms an accommodating cavity 56 around the tongue 512. The two rows of the first contact portions 521 of the mating terminals 52 are symmetrical about a center of the accommodating cavity 56 at 180 degrees.

Referring to FIG. 1 and FIG. 2, each of the first thermal conduction members 6 is a cylindrical structure and has favorable thermal conductivity. The thermal conductivity of the first thermal conduction members 6 is higher than the thermal conductivity of the metal shell 55. One end of each first thermal conduction member 6 exposed to the mating surface 41 has an accommodating slot 61. Further, each first thermal conduction member 6 has multiple contact elastic sheets 62 protruding toward the accommodating slot 61. The two accommodating slots 61 of the two first thermal conduction members 6 are symmetrical about the center of the accommodating cavity 56 at 180 degree. The other end of the first thermal conduction member 6 protrudes out of a surface of the fixed seat 4 opposite to the mating surface 41, and is in contact with a component (not illustrated) on the main board 2 to form thermal conduction. In other embodiments, the first thermal conduction members 6 may selectively be capillaries or thermal transistors. Since a capillary has a smaller diameter, a capillary bundle formed by multiple capillaries may be used, and both the capillaries and the thermal transistors have favorable thermal conductivity.

Figure 5:
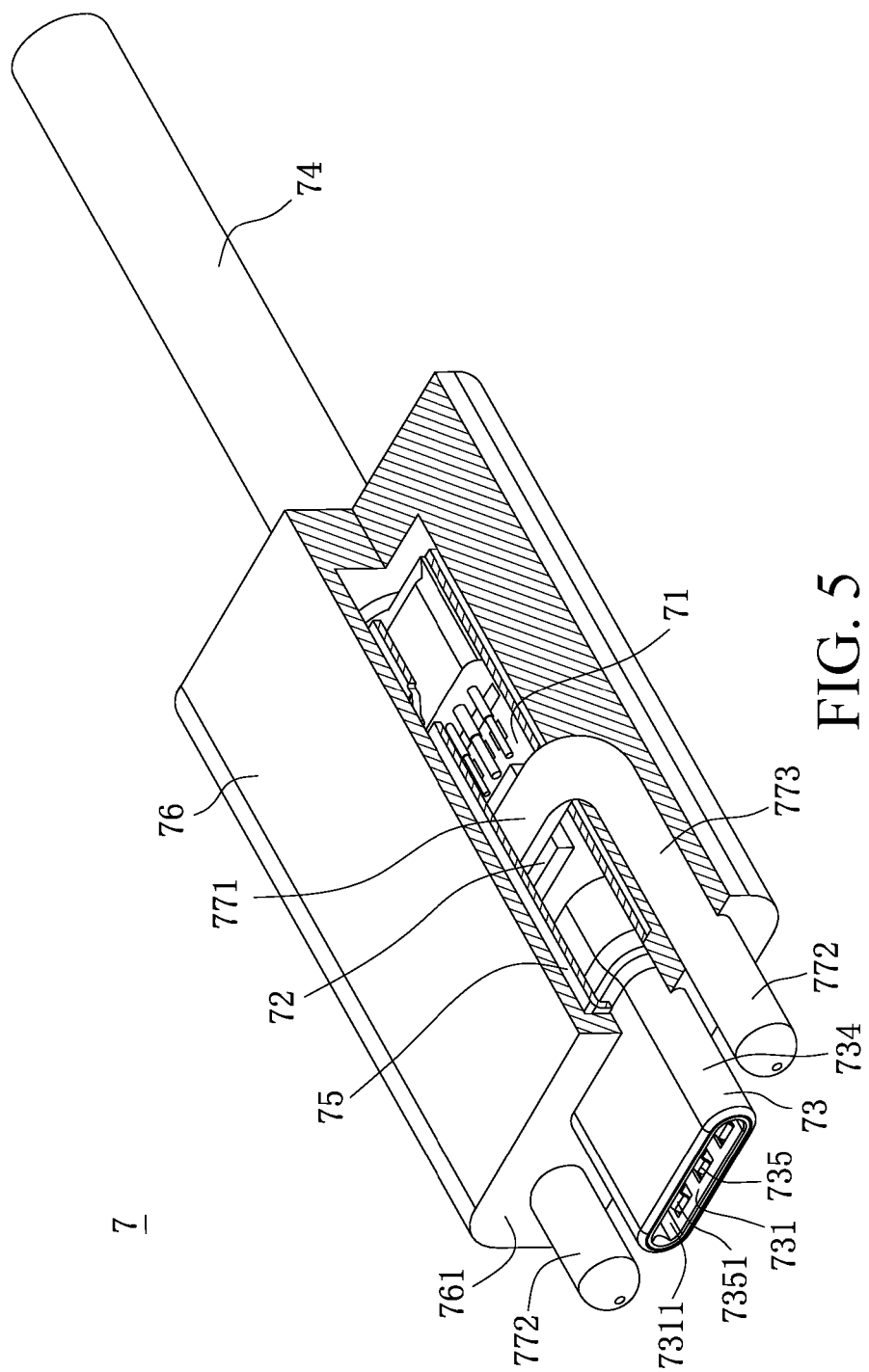
FIG. 5 is a local sectional perspective view of the plug connector in FIG. 2.
Figure 6:
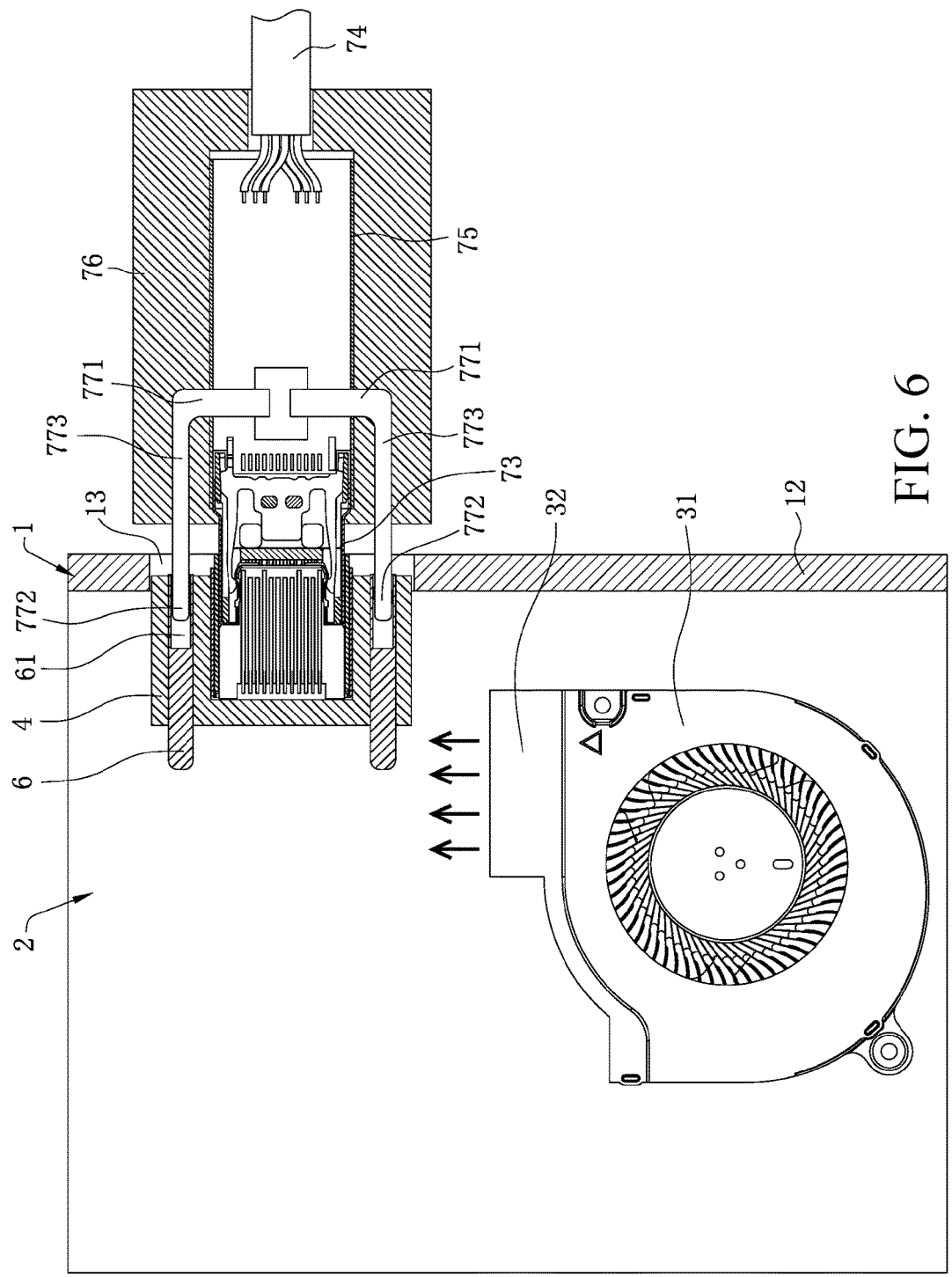
FIG. 6 is a sectional view of FIG. 1.

Referring to FIG. 3 to FIG. 5, the plug connector 7 includes a circuit board 71, at least one chip 72 provided on the circuit board 71, a mating joint 73 electrically connected to one end of the circuit board 71, a cable 74 electrically connected to the other end of the circuit board 71, a shielding cover 75, an insulating shell 76, and two second thermal conduction members 77. The mating joint 73 has an insulating body 731, multiple conductive terminals 732 provided on the insulating body 731, a latch member 733, a shielding shell 734 sleeved over the insulating body 1, and two grounding elastic sheets 735 provided on the upper and lower surfaces of the insulating body 1. A front end of the insulating body 731 has a mating slot 7311. The conductive terminals 732 are provided in two rows, and each of the conductive terminals 732 has a second contact portion 7321 protruding into the mating slot 7311. The second contact portions 7321 of the conductive terminals 732 are provided in two rows on the upper and lower sides of the mating slot 7311. The two rows of the second contact portions 7321 are symmetrical about the center of the mating slot 7311 at 180 degrees, and the conductive terminals 732 in each row satisfy USB Type-C terminal arrangement. The conductive terminals 732 in each row include, sequentially from left to right, a grounding terminal, a pair of differential signal terminals (high-speed terminals) for transmitting USB 3.0 signals, a power terminal, a reserved terminal, a pair of USB 2.0 terminals, a reserved terminal, a power terminal, a pair of differential signal terminals (high-speed terminals) for transmitting USB 3.0 signals and a grounding terminal. In this embodiment, the latch member 733 is formed by blanking a metal sheet. The latch member 733 has a body portion and two latch arms 7331 formed by extending forward from two opposite sides of the body portion. The body portion is located between the two rows of the conductive terminals 732 and configured to shield signal interference between the two rows of the conductive terminals 732. The two latch arms 7331 are located on the left and right sides of the insulating body 731, and each of the latch arms 7331 has a latch portion 7332 protruding into the mating slot 7311. The latch portions 7332 are configured to be buckled to the buckling notches 531. The shielding shell 734 is a tubular structure seamlessly connected and formed by an drawing process. Each of the grounding elastic sheets 735 is sandwiched between the insulating body 1 and the shielding shell 734. Each of the grounding elastic sheets 735 has multiple grounding contacts 7351 protruding into the mating slot 7311, and the grounding contacts 7351 are located in front of the second contact portions 7321. The shielding cover 75 is sleeved over a rear end of the shielding shell 734. The circuit board 71 is located in the shielding cover 75. The overlapped portions of the shielding cover 75 and the shielding shell 734 are fixed together by spot soldering, or may also be fixed to each other through a buckle structure. The insulating shell 76 covers the shielding cover 75 and the shielding shell 734. The insulating shell 76 has a front end surface 761. The mating joint 73 projects forward out of the front end surface 761, and the shielding shell 534 also projects forward out of the front end surface 761. In this embodiment, the insulating shell 76 is injection-molded outside of the shielding cover 75, the shielding shell 734 and the cable 74.

Referring to FIG. 3 and FIG. 5, as the increasingly higher signal transmission requirements on the plug connector 7 and the enhancement of the signal processing capacity, the chip 72 will generate abundant heat during operation. In order to enable the heat generated by the chip 72 inside the plug connector 7 to be well dissipated, the plug connector 7 is provided with the second thermal conduction members 77 having favorable thermal conductivity. The material of the second thermal conduction members 77 is different from the materials of the shielding cover 75 and the shielding shell 734, and the thermal conductivity of the second thermal conduction members 77 is higher than the thermal conductivity of the shielding cover 75 and the shielding shell 734. Each of the second thermal conduction members 77 is substantially L-shaped, and the cross-section thereof at each location is circular, of course, it can be in other shapes. The second thermal conduction members 77 are insert-molded in the insulating shell 76. Each of the second thermal conduction members 77 is provided with a conducting portion 771, a protruding portion 772 and a connecting portion 773 connected between the conducting portion 771 and the protruding portion 772. The protruding portion 772 and the connecting portion 773 respectively extend in the front-rear direction. The conducting portion 771 is formed by bending by 90 degrees from the connecting portion 773 and extending in a left-right direction. Both the conducting portion 771 and the connecting portion 773 are accommodated in the insulating shell 76, and the conducting portion 771 penetrates through the shielding cover 75 to be in contact with the chip 72. The conducting portion 771 may also be in contact with the shielding cover 75 at the same time. The connecting portion 773 is provided at intervals respectively from the shielding cover 75 and the shielding shell 734, and the connecting portion 773 is insert-molded in the insulating shell 76. The protruding portion 772 at least partially projects forward out of the front end surface 761. The protruding portion 772 and the mating joint 73 are provided at intervals side by side in the left-right direction. That is, the protruding portion 772 is located outside the shielding shell 734. The two protruding portions 772 of the two second thermal conduction members 77 are symmetrical about the center of the mating slot 7311 at 180 degrees. In other embodiments, the plug connector 7 can change its local structures. For example, the second thermal conduction members 77 may selectively be capillaries or thermal transistors. Since a capillary has a small diameter, a capillary bundle formed by multiple capillaries may be used, and both the capillaries and the thermal transistors have favorable thermal conductivity. In another example, multiple chips 72 may be provided, and the chips 72 may be provided on one surface of the circuit board 71 or provided on the opposite upper and lower surfaces of the circuit board 71. The two conducting portions 771 of the two second thermal conduction members 77 may be respectively in contact with different chips 72, or may also be in contact with the same chip 72. In a further example, the connecting portion 773 is tightly adjacent to and in contact with the shielding cover 75. In yet another example, the connecting portion 773 is tightly adjacent to and in contact with the shielding shell 734. In still another example, the conducting portion 771 may also penetrate through the rear end of the shielding shell 734 to be in contact with the chip 72, and the conducting portion 771 may also be simultaneously in contact with the shielding shell 734. In yet a further example, the conducting portion 771 may also simultaneously penetrate through the overlapped portions of the shielding cover 75 and the shielding shell 734 to be in contact with the chip 72, and the conducting portion 771 may also be simultaneously in contact with the shielding shell 734 and the shielding cover 75.

Referring to FIG. 3 to FIG. 6, when the plug connector 7 as a whole moves toward the socket connector 5, since both the mating joint 73 and the second thermal conduction members 77 are fixed to the insulating shell 76, the second thermal conduction members 77 and the mating joint 73 move simultaneously. When the plug connector 7 is completely mated with the socket connector 5 forwardly or reversely, the front end of the mating joint 73 is inserted into the accommodating cavity 56. At this time, the first contact portions 521 are in contact with the second contact portions 7321 to form an electrical connection, the latch portions 7332 are buckled to the buckling notches 531, and the grounding contact 7351 abuts the grounding member 54 to form a grounding path. Meanwhile, the protruding portions 772 are inserted into the accommodating slot 61, and the protruding portions 772 abut and are in contact with the contact elastic sheets 62, such that the protruding portions 772 and the first thermal conduction members 6 perform stable thermal conduction. The fan body 31 operates to drive air to flow quickly. Since the air outlet 32 directly faces the first thermal conduction members 6, air flow around parts of the first thermal conduction members 6 exposed outside the fixed seat 4 may be accelerated to perform heat dissipation on the first thermal conduction members 6. In addition, the air outlet 32 also accelerates air flow around the component on the main board 2 which is thermally conductive with the first thermal conduction members 6, so as to increase the heat dissipation area and accelerate the heat dissipation. The heat dissipated into the casing 1 is then transferred to the outside air through the heat dissipation structure in the casing 1.

Figure 7:
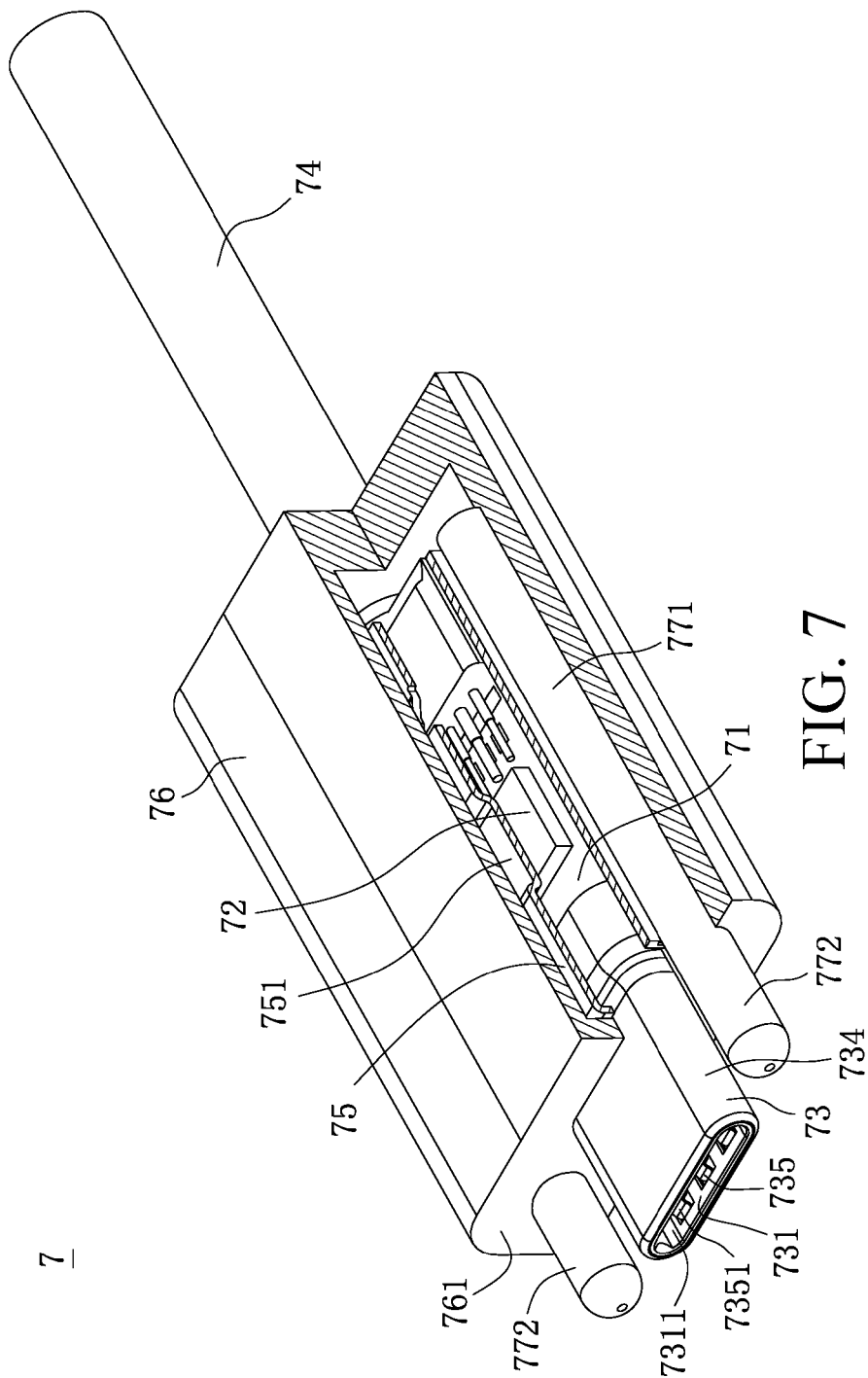
FIG. 7 is a local sectional perspective view of the plug connector in FIG. 1 according to another embodiment.

Referring to FIG. 7, an embodiment is provided where only the local structure of the plug connector 7 in the first embodiment is changed. The heat generated by the chip 72 may also be abundantly dissipated out of the inside of the plug connector 7. The same structures in this embodiment as those in the first embodiment are not elaborated in details. The structure of the plug connector 7 being changed is described as follows. In this embodiment, there is only one second thermal conduction member 77. The second thermal conduction member 77 is located outside the shielding cover 75 and the shielding shell 734, and the second thermal conduction member 77 as a whole extends in the front-rear direction. At this time, the shielding cover 75 is provided with an abutting portion 751. The abutting portion 751 is in contact with the chip 72, and the conducting portions 771 are simultaneously in contact with the shielding cover 75. In other embodiments, the conducting portions 771 may be simultaneously in contact with the shielding cover 75 and the shielding shell 734. Of course, two second thermal conduction members 77 may also be provided respectively on the left and right sides of the mating joint 73, similar to the structure as described in the first embodiment as mentioned above.

Figure 8:
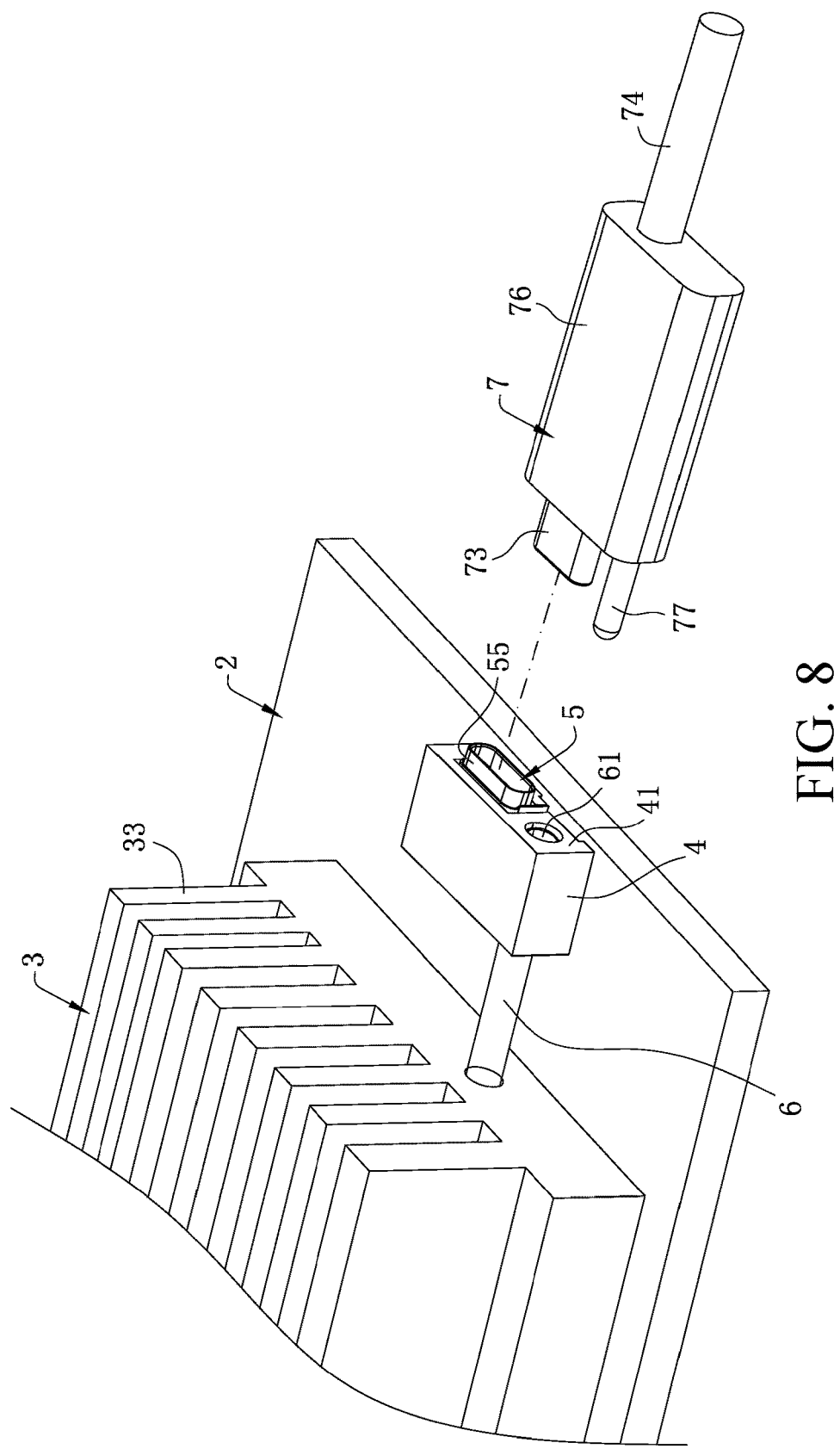
FIG. 8 is a perspective view of an assembly having thermal conduction members according to a second embodiment of the present invention.

Referring to FIG. 8, an assembly having thermal conduction members according to a second embodiment of the present invention is provided. The general structures of the assembly in this embodiment are the same as those of the first embodiment, and the same structures will not be elaborated again. The different structures in this embodiment are described as follows. Only one side of the socket connector 5 is provided with a first thermal conduction member 6, and the first thermal conduction member 6 is directly connected to the heat dissipating device 3. Only one side of the mating joint 73 is provided with a second thermal conduction member 77. In this embodiment, the heat dissipating device 3 is a heat sink having multiple cooling fins 33, such that the heat inside the plug connector 7 is transferred to the heat dissipating device 3 sequentially through the second thermal conduction member 77 and the first thermal conduction member 6.

Figure 9:
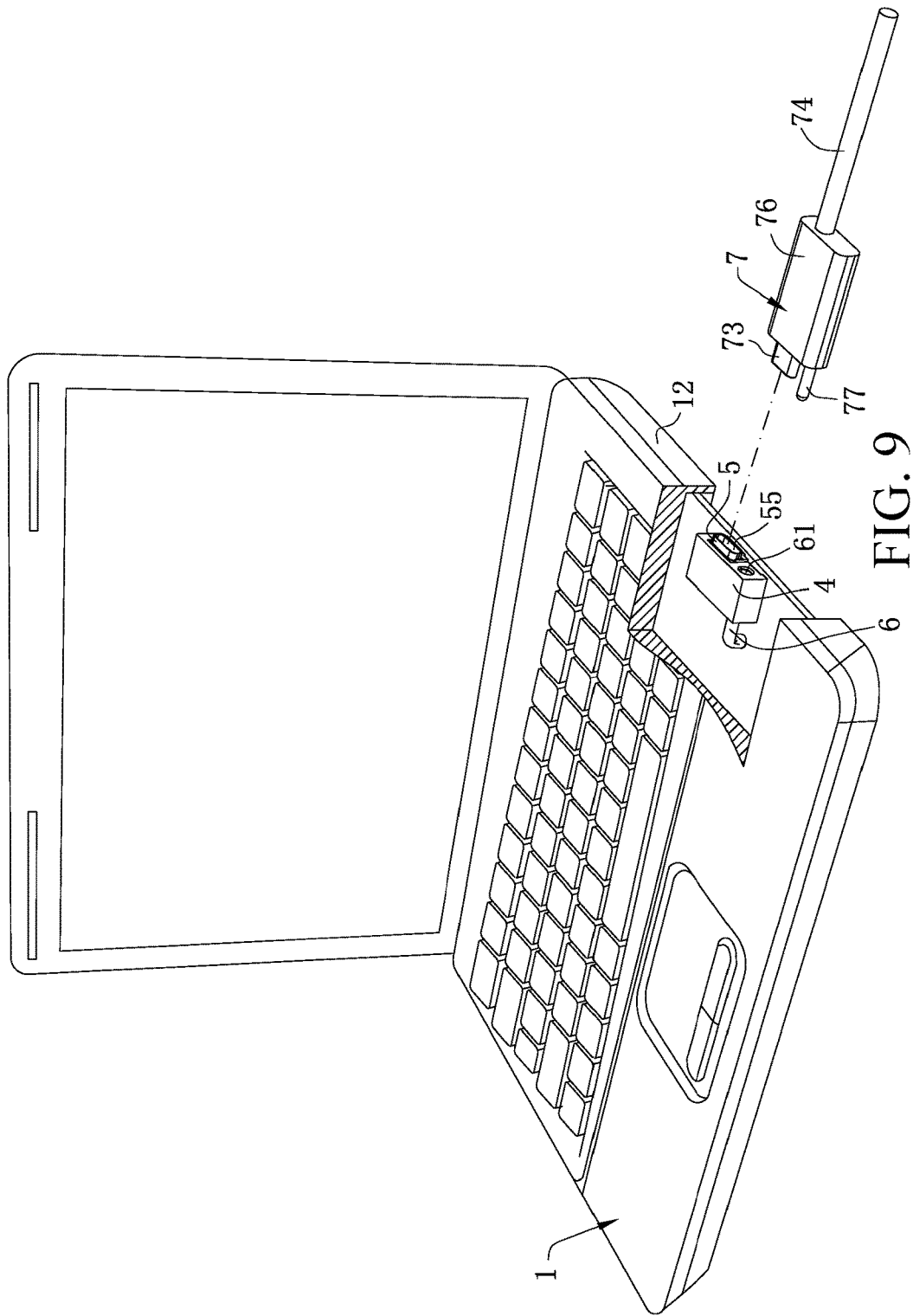
FIG. 9 is a local perspective sectional view of an assembly having thermal conduction members according to a third embodiment of the present invention.

Referring to FIG. 9, an assembly having thermal conduction members according to a third embodiment of the present invention is provided. The general structures of the assembly in this embodiment are the same as those of the first embodiment, and the same structures will not be elaborated again. The different structures in this embodiment are described as follows. The plug connector 7 may be provided with only one second thermal conduction member 77. If only one side of the socket connector 5 is provided with a first thermal conduction member 6, the plug connector 7 can only be inserted into the socket connector 5 in one direction. If both the left and right sides of the socket connector 5 are respectively provided with the first thermal conduction members 6, the plug connector 7 may also be inserted into the socket connector 5 forwardly or reversely.

Figure 10:
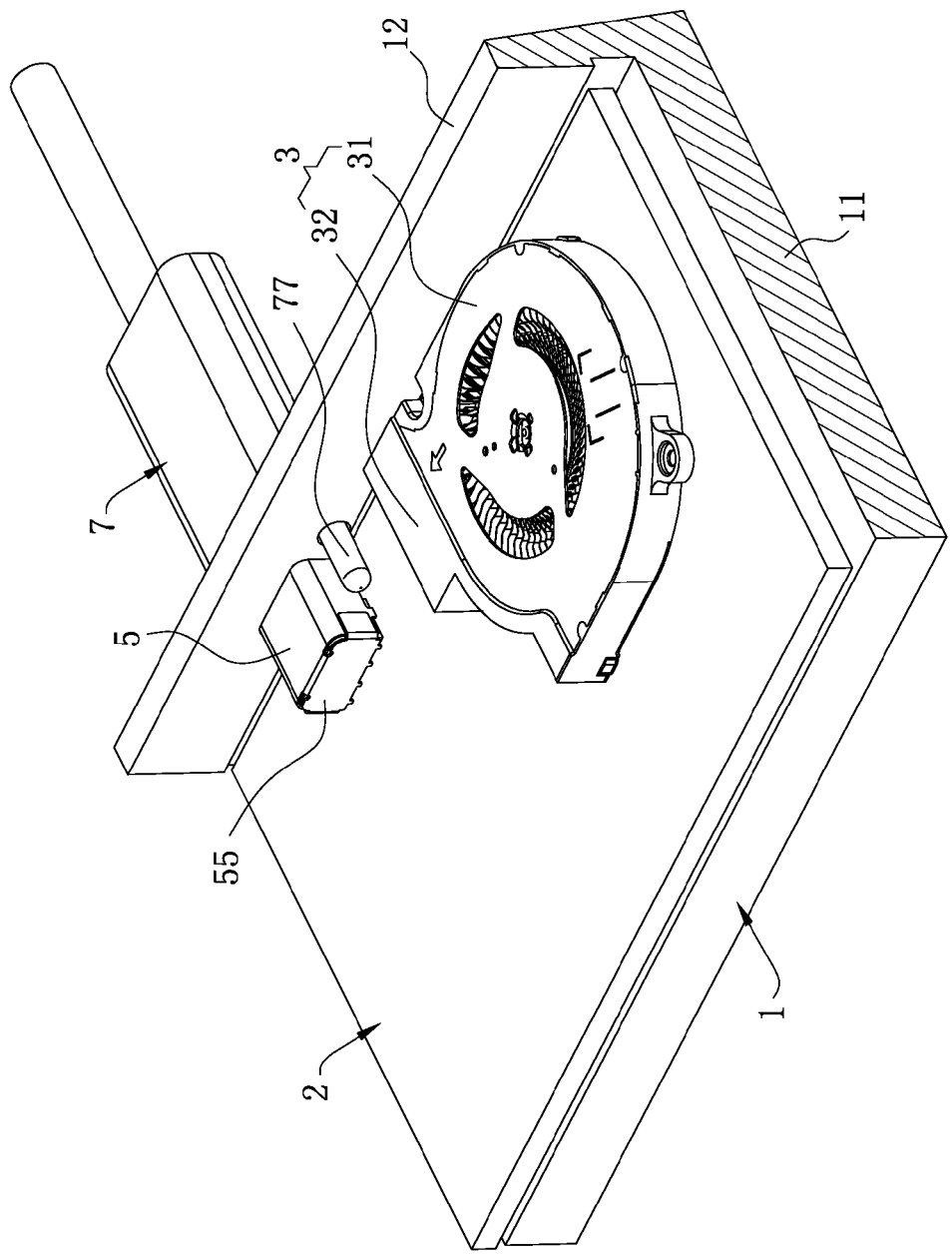
FIG. 10 is a perspective view of a fourth embodiment of the assembly having thermal conduction members according to the present invention.
Figure 11:
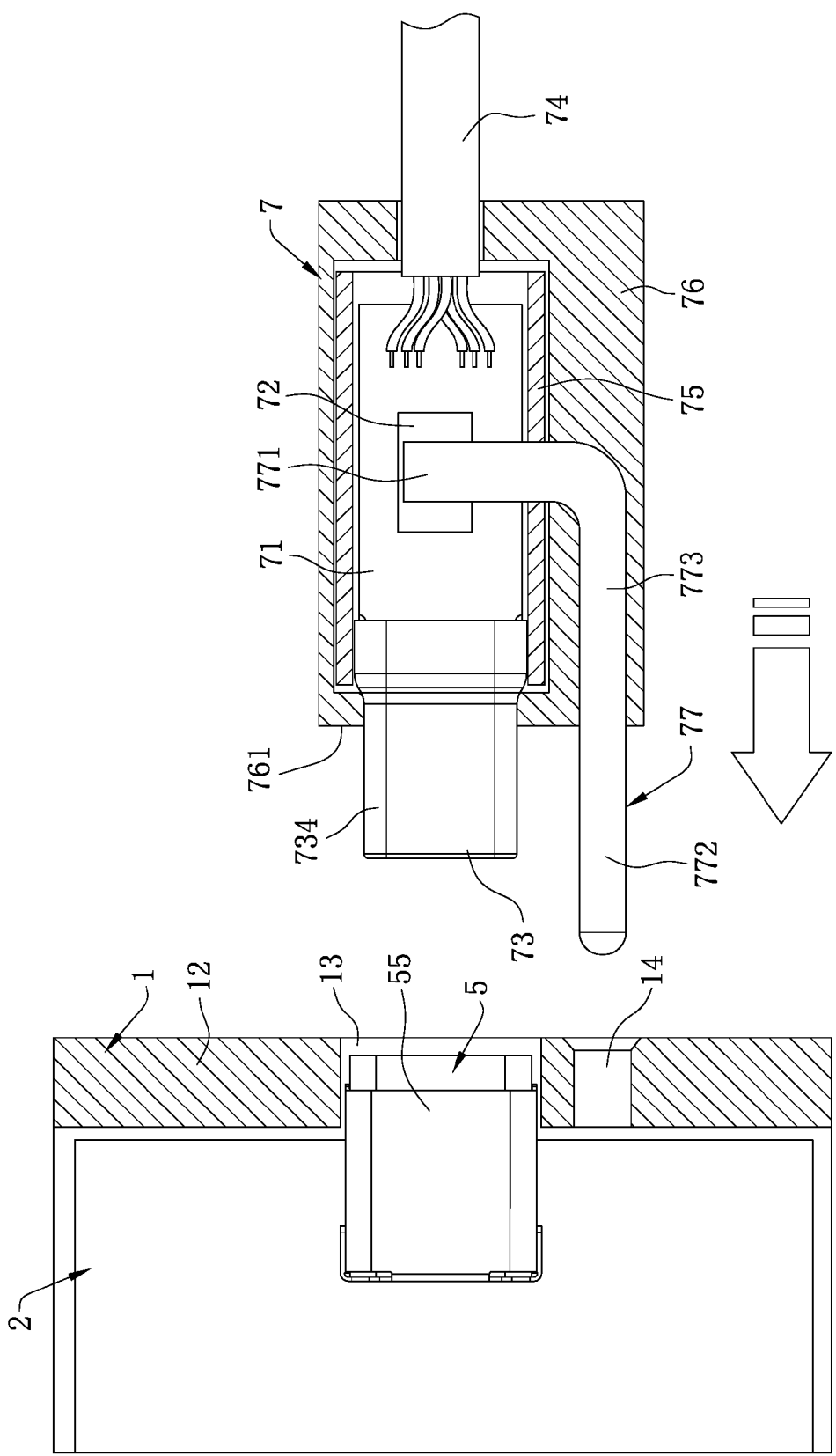
FIG. 11 is a local sectional schematic view of FIG. 10 before the plug connector is mated with the socket connector.
Figure 12:
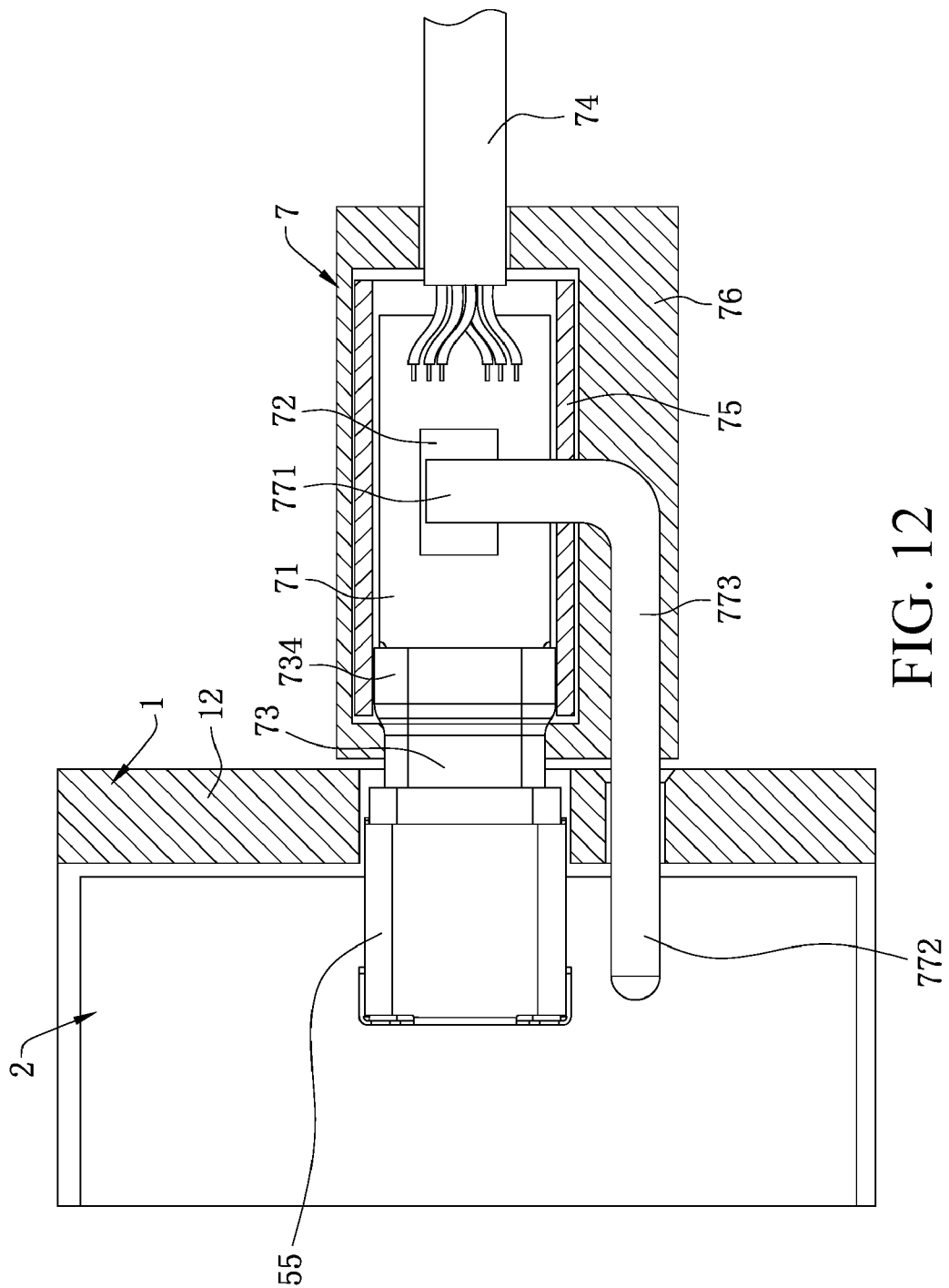
FIG. 12 is a schematic view of FIG. 11 after the plug connector is mated with the socket connector.

Referring to FIG. 10 to FIG. 12, an assembly having thermal conduction members according to a fourth embodiment of the present invention is provided. The general structures of the assembly in this embodiment are the same as those of the first embodiment, and the same structures will not be elaborated again. The different structures in this embodiment are described as follows. In this embodiment, the casing 1 is made of a metal material, and the casing 1 is also functioned as a first thermal conduction member. In other words, the assembly in this embodiment does not have the first thermal conduction member different and separated from the casing 1 in the first embodiment. The side wall 12 having the opening 13 thereon is also provided with an insertion hole 14. The insertion hole 14 is located on the side of the opening 13, and the insertion hole 14 and the opening 13 are isolated from each other with an interval therebetween. The plug connector 7 is provided with only one second thermal conduction member 77, and a length of the protruding portion 772 protruding forward relative to the front end surface 761 is greater than a length of the mating joint 73 protruding forward relative to the front end surface 761. When the plug connector 7 as a whole moves toward the socket connector 5, the protruding portion 772 firstly protrudes into the insertion hole 14 to be in contact with the casing 1, and guides the front end of the mating joint 73 to be inserted into the socket connector 5. When the plug connector 7 is completely mated with the socket connector 5, the electrical connection thereof is implemented. The length of the protruding portion 772 protruding in the casing 1 is substantially equal to the length of the socket connector 5 in the front-rear direction. The air outlet 32 and the protruding portion 772 are located at the same side of the socket connector 5, and the air outlet 32 is provided to be away from the socket connector 5 relative to the protruding portion 772. Thus, when the fan body 31 operates, air is driven to flow quickly. Since the air outlet 32 directly faces the protruding portion 772, the air flow around the protruding portion 772 is accelerated to perform heat dissipation on the second thermal conduction member 77. Meanwhile, the heat generated by the plug connector 7 is partially dissipated by the casing 1 with a large area.

Figure 13:
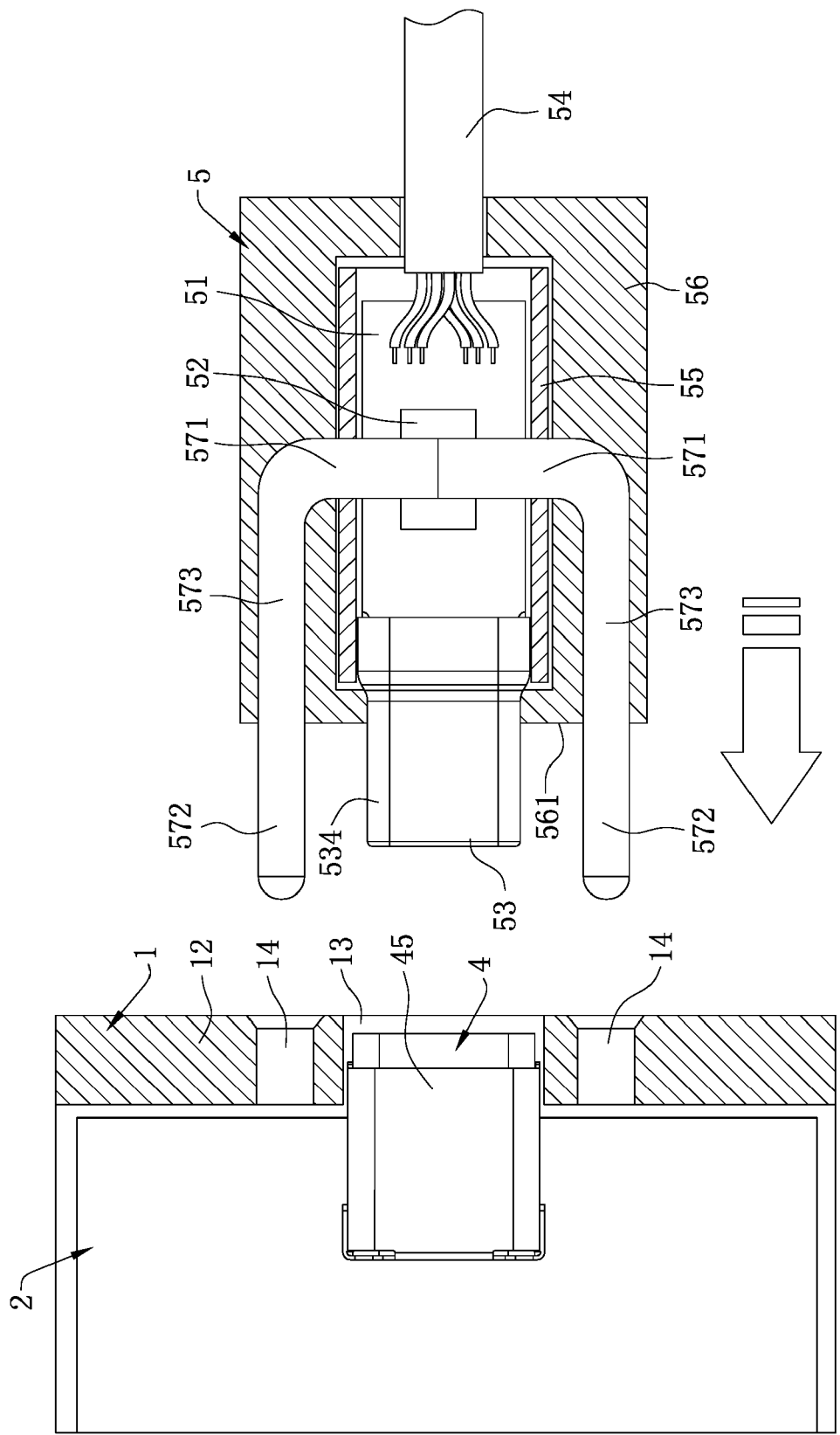
FIG. 13 is a schematic view of an assembly having thermal conduction members according to a fifth embodiment of the present invention.

Referring to FIG. 13, an assembly having thermal conduction members according to a fifth embodiment of the present invention is provided. The general structures of the assembly in this embodiment are the same as those of the fourth embodiment, and the same structures will not be elaborated again. The different structures in this embodiment are described as follows. There are two insertion holes 14 provided, and they are located on two opposite sides of the opening 13. The plug connector 7 is correspondingly provided with the two second thermal conduction members 77. In this embodiment, the plug connector 7 can be inserted into the socket connector 5 in two directions.

To sum up, the assembly having thermal conduction members according to certain embodiments of the present invention has the following beneficial effects:

1. The plug connector 7 is provided with the second thermal conduction member 77 which is thermally conductive with the chip 72 therein. The protruding portion 772 of the second thermal conduction member 77 projects out of the plug connector 7. The plug connector 7 as a whole moves toward the socket connector 5 exposed to the opening 13. When the plug connector 7 is mated with the socket connector 5, the protruding portion 772 is in contact with the first thermal conduction member 6 to perform thermal conduction, and the heat generated by the chip 75 can be transferred to the first thermal conduction member 6 through the second thermal conduction member 77, thereby quickly dissipating the heat generated by the chip 72.

2. The plug connector 7 is provided with the second thermal conduction member 77 which is thermally conductive with the chip 72 therein. The protruding portion 772 of the second thermal conduction member 77 projects out of the plug connector 7. The plug connector 7 as a whole moves toward the socket connector 5 exposed to the opening 13. When the plug connector 7 is mated with the socket connector 5, the protruding portion 772 protrudes into the casing 1 to be in contact with the casing 1 made of the metal material. The heat dissipating device 3 in the casing 1 accelerates air flow around the protruding portion 772 to perform heat dissipation on the second thermal conduction member 77. Meanwhile, the casing 1 can also implement large-area heat dissipation, such that the heat generated by the chip 72 can be quickly dissipated out from the inside of the plug connector 7.

3. The protruding portion 772 and the mating joint 73 respectively extend out of the front end surface 761. The length of the protruding portion 772 protruding forward relative to the front end surface 761 is greater than the length of the mating joint 73 protruding forward relative to the front end surface 761. When the plug connector 7 is mated with the socket connector 5, the protruding portion 772 is firstly inserted into the insertion hole 14 so as to guide the mating joint 73 to be inserted into the socket connector 5. In addition, the longer portion of the protruding portion 772 protrudes into the casing 1, thereby increasing the heat dissipation area of the heat dissipating device 3 for the second thermal conduction member 77.

4. The conducting portions 771 penetrate through the shielding cover 75 to be in contact with the chip 72, and the conducting portions 771 are simultaneously in contact with the shielding cover 75. Thus, the heat generated by the chip 72 may be transferred out through the second thermal conduction member 77. Further, a part of the heat generated by the chip 72 can be transferred to the metal shell 55 through the contact between the shielding shell 734 and the metal shell 55 when the plug connector 7 is mated with the socket connector 5, thereby increasing the heat dissipation area. Moreover, the heat dissipating device 3 may also accelerate air flow around the metal shell 55 to perform heat dissipation on the metal shell 55.

5. The shielding cover 75 is provided with the abutting portion 751 which is in contact with the chip 72, and the conducting portion 771 is in contact with the shielding cover 75, such that the heat generated by the chip 72 may be transferred out through the second thermal conduction member 77. Further, a part of the heat generated by the chip 72 can be transferred to the metal shell 55 through the contact between the shielding shell 734 and the metal shell 55 when the plug connector 7 is mated with the socket connector 5. Moreover, the heat dissipating device 3 may also accelerate air flow around the metal shell 55 to perform heat dissipation on the metal shell 55.

6. The insulating shell 76 is injection-molded outside of the shielding cover 75 and the shielding shell 734, and the second thermal conduction member 77 is insert-molded into the insulating shell 76, such that the mating joint 73 and the second thermal conduction member 77 can be stably retained to the inside of the insulating shell 76.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An assembly, comprising:
   a socket connector, having an insulating seat, a plurality of mating terminals provided on the insulating seat, and a metal shell provided outside the insulating seat;
   at least one first thermal conduction member, located outside the metal shell; and
   a plug connector, comprising:
      a circuit board;
      at least one chip, provided on the circuit board;
      a mating joint, electrically connected to one end of the circuit board, wherein the mating joint has an insulating body, a plurality of conductive terminals provided on the insulating body, and a shielding shell provided outside the insulating body; and
      at least one second thermal conduction member, having at least one conducting portion and at least one protruding portion, wherein the conducting portion is thermally conductive with the chip, the protruding portion is located outside the shielding shell, and when the mating joint is mated with the socket connector, the mating terminals are in contact with the conductive terminals to form an electrical connection, and the protruding portion is in contact with the first thermal conduction member to perform thermal conduction.

2. The assembly of claim 1, wherein at least one of the first thermal conduction member and the second thermal conduction member is a thermal transistor or a capillary.

3. The assembly of claim 1, further comprising a fixed seat, wherein the socket connector and the first thermal conduction member are respectively provided on the fixed seat.

4. The assembly of claim 1, further comprising a casing and a heat dissipating device provided in the casing, wherein the casing has an opening communicating with an outside, the socket connector and the first thermal conduction member are respectively exposed to the opening, and the heat dissipating device is configured to perform heat dissipation on the first thermal conduction member.

5. The assembly of claim 1, further comprising a heat dissipating device, wherein the first thermal conduction member is connected with the heat dissipating device.

6. The assembly of claim 1, wherein the first thermal conduction member has an accommodating slot configured for insertion of the protruding portion.

7. The assembly of claim 1, wherein the plug connector further comprises a shielding cover provided at a rear end of the mating joint, wherein the circuit board is accommodated in the shielding cover, the shielding cover has at least one abutting portion in contact with the chip, and the conducting portion is in contact with the shielding cover.

8. The assembly of claim 1, wherein a front end of the insulating body has a mating slot, each of the conductive terminals has a contact portion protruding into the mating slot, the contact portions of the conductive terminals are provided in two rows on an upper side and a lower side of the mating slot, two second thermal conduction members are provided at a left side and a right side of the mating joint, the two protruding portions of the two second thermal conduction members are symmetrical about a center of the mating slot at 180 degrees, and the plug connector is mated with the socket connector forwardly or reversely.

9. The assembly of claim 1, wherein the plug connector further comprises an insulating shell provided on a rear end of the shielding shell, wherein the conducting portion is accommodated in the insulating shell, the insulating shell has a front end surface, and the shielding shell and the protruding portion respectively protrude forward from the front end surface.

10. The assembly of claim 9, wherein a length of the protruding portion protruding forward relative to the front end surface is greater than a length of the mating joint protruding forward relative to the front end surface.

11. The assembly of claim 9, wherein the insulating shell is injection-molded to the rear end of the shielding shell, and the second thermal conduction member is insert-molded in the insulating shell.

12. The assembly of claim 1, wherein the plug connector further comprises a shielding cover provided on a rear end of the mating joint, the circuit board is accommodated in the shielding cover, and the conducting portion penetrates through the shielding cover to be in contact with the chip.

13. The assembly of claim 12, wherein the conducting portion is in contact with at least one of the shielding cover and the shielding shell.

14. The assembly of claim 1, wherein the first thermal conduction member is a casing made of a metal material, one side of the casing is provided with an opening, and the socket connector is exposed to the opening and mated with the plug connector.

15. The assembly of claim 14, wherein a main board and a heat dissipating device are provided in the casing, the socket connector is mounted on the main board, and when the mating joint is mated with the socket connector, the protruding portion at least partially protrudes into the casing, and the heat dissipating device accelerates air flow around the protruding portion to perform heat dissipation on the second thermal conduction member.

16. The assembly of claim 15, wherein the casing is provided with an insertion hole on at least one side of the opening for the protruding portion to pass therethrough, and the insertion hole is isolated from the opening.

17. The assembly of claim 15, wherein the heat dissipating device has an air outlet, the air outlet and one of the at least one protruding portion are located on a same side of the socket connector as one of the protruding portion, and the air outlet is provided to be away from the socket connector relative to the one of the at least one protruding portion.

18. A plug connector, comprising:
   a circuit board;
   at least one chip, provided on the circuit board;
   a mating joint, electrically connected to one end of the circuit board, wherein the mating joint has an insulating body, a plurality of conductive terminals provided on the insulating body, and a shielding shell provided outside the insulating body, the insulating body has a mating slot, each of the conductive terminals has a contact portion protruding into the mating slot, the contact portions of the conductive terminals are provided in two rows on two opposite sides of the mating slot, and the two rows of the contact portions are symmetrical about a center of the mating slot at 180 degrees; and
   two thermal conduction members, provided at a left side and a right side of the mating joint, each of the two thermal conduction members having at least one conducting portion and at least one protruding portion, wherein the conducting portion of each of the two thermal conduction members is thermally conductive with the chip, the protruding portion of each of the two thermal conduction members is located outside the shielding shell, and the two protruding portions of the two thermal conduction members are symmetrical about the center of the mating slot at 180 degrees.

19. An assembly, comprising:
a casing, provided with an opening at one side thereof;
a main board, provided in the casing;
a heat dissipating device, provided in the casing;
a socket connector, mounted on the main board and exposed at the opening; and
a plug connector, comprising:
 a circuit board;
 at least one chip, provided on the circuit board;
 a mating joint, electrically connected to one end of the circuit board; and
 at least one thermal conduction member, having at least one conducting portion and at least one protruding portion, wherein the conducting portion is in direct contact with the chip, the protruding portion is located outside the mating joint, and when the mating joint is mated with the socket connector to form an electrical connection, the protruding portion is at least partially protruding into the casing, and the heat dissipating device accelerates air flow around the protruding portion to perform heat dissipation on the at least one thermal conduction member.

20. The assembly of claim 19, wherein the mating joint has an insulating body, a plurality of conductive terminals provided on the insulating body, and a shielding shell provided outside the insulating body, the plug connector further comprises an insulating shell provided on a rear end of the shielding shell, the protruding portion is located outside the shielding shell, and the protruding portion and the mating joint protrude out of a same side of the insulating shell.

\* \* \* \* \*